(12) United States Patent
Brodsky et al.

(10) Patent No.: US 8,212,156 B2
(45) Date of Patent: Jul. 3, 2012

(54) PLASTIC LAND GRID ARRAY (PLGA) MODULE AND PRINTED WIRING BOARD (PWB) WITH ENHANCED CONTACT METALLURGY CONSTRUCTION

(75) Inventors: William Louis Brodsky, Binghamton, NY (US); Mark Kenneth Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 860 days.

(21) Appl. No.: 12/146,757

(22) Filed: Jun. 26, 2008

(65) Prior Publication Data

US 2009/0321125 A1 Dec. 31, 2009

(51) Int. Cl.
*H05K 7/02* (2006.01)
*H05K 1/11* (2006.01)
*H01R 43/02* (2006.01)

(52) U.S. Cl. ........ 174/263; 174/261; 174/262; 361/767; 361/770; 361/773; 361/776; 29/829; 29/884

(58) Field of Classification Search .......... 174/261–263; 361/767, 770, 773, 776; 29/829, 884
See application file for complete search history.

(56) References Cited

U.S. PATENT DOCUMENTS

| | | | | |
|---|---|---|---|---|
| 4,940,181 A | * | 7/1990 | Juskey et al. | ............ 228/180.21 |
| 5,152,694 A | | 10/1992 | Bargain | |
| 5,446,625 A | * | 8/1995 | Urbish et al. | ................. 361/761 |
| 5,967,797 A | | 10/1999 | Maldonado | |
| 6,080,936 A | * | 6/2000 | Yamasaki et al. | ............. 174/263 |
| 6,316,737 B1 | * | 11/2001 | Evans et al. | .................... 174/260 |
| 6,437,989 B1 | * | 8/2002 | Lopatin et al. | ................ 361/760 |
| 6,690,185 B1 | * | 2/2004 | Khandros et al. | ........ 324/756.03 |
| 6,784,377 B2 | * | 8/2004 | Chamberlin et al. | ......... 174/265 |
| 2002/0011001 A1 | * | 1/2002 | Beaman et al. | ................. 29/844 |
| 2003/0173109 A1 | * | 9/2003 | Suehiro | ......................... 174/258 |
| 2008/0239683 A1 | * | 10/2008 | Brodsky et al. | ............... 361/760 |

OTHER PUBLICATIONS

"Amphenol InterCon Systems—C-Byte High Speed Connection System—Design Overview", <http://www.interconsystems.com/c-bytedesign.php>, Jun. 2008.

* cited by examiner

*Primary Examiner* — Anatoly Vortman
(74) *Attorney, Agent, or Firm* — Matthew J. Bussan

(57) ABSTRACT

An enhanced contact metallurgy construction for plastic land grid array (PLGA) modules and printed wiring boards (PWBs). The PWB may, for example, have subcomposite laminate construction and/or a double-sided LGA site. A plurality of preform contacts are each respectively soldered to one of a plurality of metal pads on a PLGA module carrier and/or a PWB. Each of the preform contacts comprises a metal preform base (e.g., copper, nickel) soldered to one of the plurality of metal pads and an electrolytic noble metal plating (e.g., gold) over the metal preform base. An electrolytic non-noble metal underplating (e.g., nickel) may be interposed between the metal preform base and the electrolytic noble metal plating. In one embodiment, the electrolytic non-noble metal underplating is 80-400 microinches thick to provide an enhanced diffusion barrier, and the electrolytic noble metal plating is 30-60 microinches thick and incorporates one or more hardening agents to provide enhanced wear and corrosion resistance.

19 Claims, 14 Drawing Sheets

PLASTIC LAND GRID ARRAY (PLGA) MODULE AND PRINTED WIRING BOARD (PWB) WITH ENHANCED CONTACT METALLURGY CONSTRUCTION

BACKGROUND OF THE INVENTION

1. Field of Invention

The present invention relates in general to the electrical connector field. More particularly, the present invention relates to plastic land grid array (PLGA) modules and/or printed wiring boards (PWBs) incorporating contact pad preforms.

2. Background Art

Electrical connectors are in widespread use in the electronics industry. In many computer and other electronic circuit structures, an electronic module such as a central processor unit (CPU), memory module, application-specific integrated circuit (ASIC) or other integrated circuit, must be connected to a printed wiring board (PWB). Printed wiring boards are also known as printed circuit boards (PCBs). When populated with one or more electronic components, a printed wiring board is often referred to as a printed wiring board assembly (PWBA) or a printed circuit board assembly (PCBA). In connecting an electronic module to a PWB, a plurality of individual electrical contacts on the base of the electronic module must be connected to a plurality of corresponding individual electrical contacts on the PWB. This set of contacts on the PWB dedicated to contacting the electronic module contacts is known as a land grid array (LGA) site when a LGA connector is used to connect the electronic module to the PWB.

Rather than permanently soldering the electronic module contacts to the LGA site, it is desirable to use LGA connectors that allow the electronic module to be installed to and removed from the LGA site. LGA connectors provide the user with the flexibility to upgrade or replace electronic modules during the manufacturing cycle and in the field. LGA connectors are also known as interconnects. Generally, LGA connectors include "true" LGA connectors where both the PWB and the electronic module are mated with contacts through mechanical/pressure contact, as well as "hybrid" LGA connectors where the contacts are soldered to the PWB and make mechanical/pressure contact with the electronic module.

In general, LGA connectors provide electrical connections between two parallel electrical substrates in computing equipment through the use of an interposer. Typically, one of these substrates is a PWB and the other is an electronic module having either a ceramic laminate substrate or an organic laminate substrate. In the latter case of an electronic module having an organic laminate substrate, which is referred to herein as a plastic land grid array (PLGA) module, a plurality of individual LGA connectors extending through the interposer provide electrical connection between a plurality of corresponding individual electrical contacts on the PWB and on the PLGA module.

Most LGA connector technologies utilize individual electrical contacts that bear on wear resistant noble metal contact finishes to ensure interconnect robustness through application life. Although LGA connectors possess optimized surface finishes, various package process methods for PLGA modules limit the amount, thickness, and type of noble metal finish that can be directly plated onto the interconnect pads of PLGA modules. Electrolytic nickel and gold plating processes, for example, generally cannot be used on the interconnect pads of PLGA modules due toe electrical commoning requirements that drive wiring and process issues associated with the contact interface structure. It is typically preferable to use electrolytic nickel and gold plating processes to plate interconnect pads, if possible, because these processes can provide a thick nickel underplating (which may, for example, minimize diffusion of copper from the interconnect pad) and a thick, hard gold plating (which may, for example, provide wear and corrosion resistance).

Instead, electroless nickel and gold plating processes must generally be used on the interconnect pads of PLGA modules. Although these surface finish types offer some level of chemical nobility, thickness and hardness, the electroless nickel and gold plating processes are very restricted and provide narrow, if any, margin to ensure surface finish reliability in service. For example, electroless nickel and gold plating processes provide a relatively thin nickel underplating (which is less likely to sufficiently limit diffusion of copper from the interconnect pad) and a relatively thin, porous gold plating (which is less likely to provide sufficient wear and corrosion resistance). These limitations can be especially problematic in service applications that involve high plug/unplug counts and/or in service applications that are performed in corrosive operating environments.

Similar limitations also arise with respect to the other substrate connected by LGA connectors, i.e., the PWB. For example, the noble metal plating techniques typically used for plating interconnect pads on PWBs are impractical for a PWB that requires a subcomposite laminate construction and/or one or more double-sided LGA sites.

It should therefore be apparent that a need exists for an enhanced contact metallurgy construction for PLGA modules and/or PWBs, especially PWBs having a subcomposite laminate construction and/or a double-sided LGA site.

SUMMARY OF THE INVENTION

According to the preferred embodiments of the present invention, a plurality of preform contacts are each respectively soldered to one of a plurality of metal pads on a plastic land grid array (PLGA) module carrier and/or a printed wiring board (PWB). The PWB may, for example, have a subcomposite laminate construction and/or a double-sided LGA site. Each of the preform contacts comprises a metal preform base (e.g., copper, nickel) soldered to one of the plurality of metal pads and an electrolytic noble metal plating (e.g., gold) over the metal preform base. An electrolytic non-noble metal underplating (e.g., nickel) may be interposed between the metal preform base and the electrolytic noble metal plating. In one embodiment, the electrolytic non-noble metal underplating is 80-400 microinches thick to provide an enhanced diffusion barrier, and the electrolytic noble metal plating is 30-60 microinches thick and incorporates one or more hardening agents to provide enhanced wear and corrosion resistance.

In one embodiment, the preform contacts are soldered to the metal pads by stenciling the metal pads with a solder paste and then reflowing the solder paste. In another embodiment, the preform contacts are soldered to the metal pads by applying a fluxed solder preform to the metal pads and then reflowing the fluxed solder preform.

Preferably, the preform contacts are attached to a preform array carrier, which may be temporary or permanent. Such a preform array carrier, if utilized, may additionally incorporate support projections and/or mechanical alignment features.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS 1.0 Overview

In accordance with the preferred embodiments of the present invention, a plurality of preform contacts are each respectively soldered to one of a plurality of metal pads on a plastic land grid array (PLGA) module carrier and/or a printed wiring board (PWB). The PWB may, for example, have a subcomposite laminate construction and/or a double-sided LGA site. Each of the preform contacts comprises a metal preform base (e.g., copper, nickel) soldered to one of the plurality of metal pads and an electrolytic noble metal plating (e.g., gold) over the metal preform base. An electrolytic non-noble metal underplating (e.g., nickel) may be interposed between the metal preform base and the electrolytic noble metal plating. In one embodiment, the electrolytic non-noble metal underplating is 80-400 microinches thick to provide an enhanced diffusion barrier, and the electrolytic noble metal plating is 30-60 microinches thick and incorporates one or more hardening agents to provide enhanced wear and corrosion resistance.

In one embodiment, the preform contacts are soldered to the metal pads by stenciling the metal pads with a solder paste and then reflowing the solder paste. In another embodiment, the preform contacts are soldered to the metal pads by applying a fluxed solder preform to the metal pads and then reflowing the fluxed solder preform.

Preferably, the preform contacts are attached to a preform array carrier, which may be temporary or permanent. Such a preform array carrier, if utilized, may additionally incorporate support projections and/or mechanical alignment features.

2.0 Detailed Description

Figure 1:
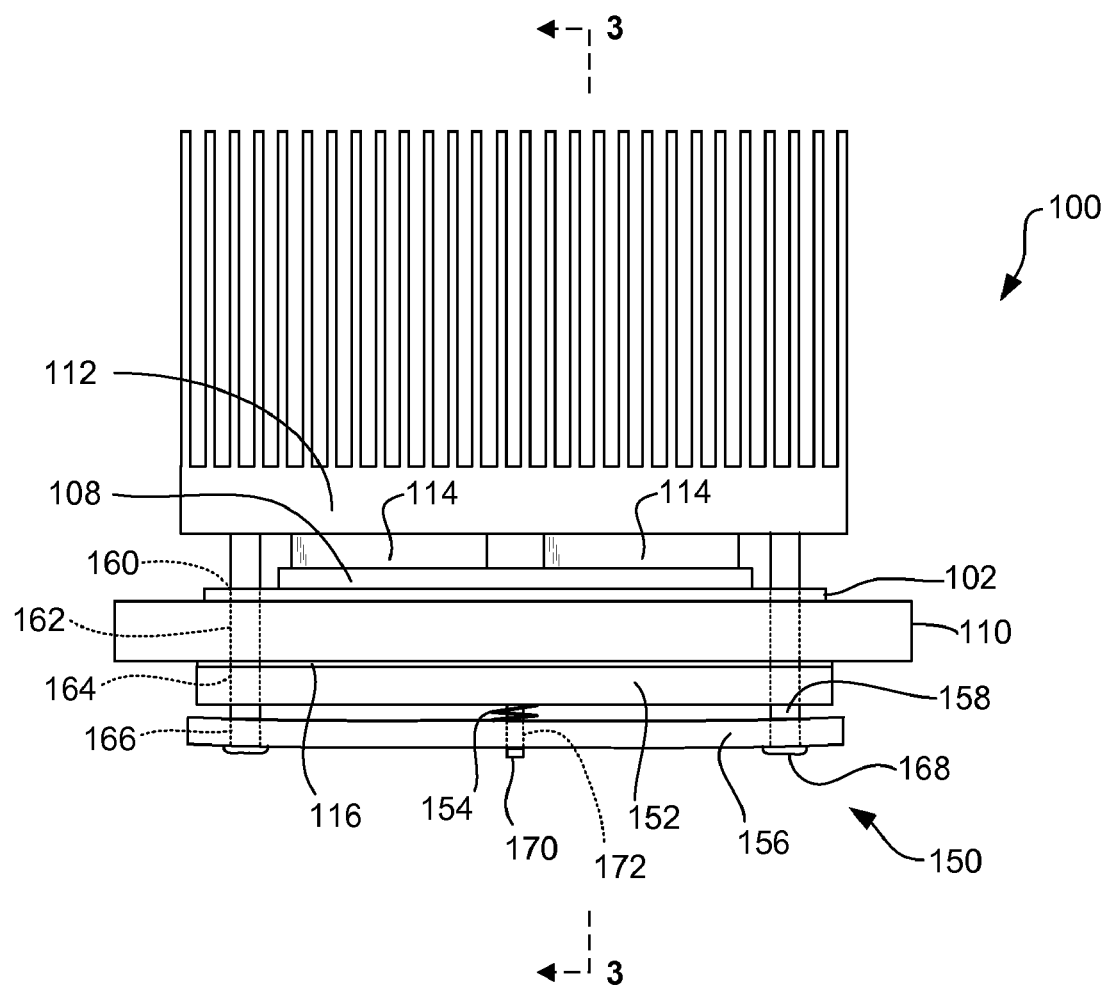
FIG. 1 is a side perspective view of a printed wiring board assembly (PWBA) having a printed wiring board (PWB) and a module substrate, either or both of which incorporates an enhanced contact metallurgy construction in accordance with the preferred embodiments of the present invention.

With reference to the figures and in particular FIG. 1, there is depicted, in a side perspective view, a printed wiring board assembly (PWBA) 100 having a module substrate 108 and a printed wiring board (PWB) 110, at least one of which incorporates an enhanced contact metallurgy construction in accordance with the preferred embodiments of the present invention. Preferably, the module substrate 108 is an organic laminate substrate (also referred to herein as a plastic land grid array (PLGA) module carrier or "PLGA module carrier") and incorporates an enhanced contact metallurgy construction in accordance with the preferred embodiments of the present invention. Various package process methods for PLGA modules limit the amount, thickness, and type of noble metal finish that can be directly plated onto the interconnect pads of PLGA modules. This obstacle is overcome in accordance with the preferred embodiments of the present invention by soldering preform contacts onto the interconnect pads of PLGA modules. Hence, in accordance with the preferred embodiments of the present invention, electrolytic nickel and gold plated surfaces are provided on the interconnect pads of PLGA modules without exposing the interconnect pads to electrolytic nickel and gold plating processes. In accordance with the preferred embodiments of the present invention, only the preform contacts are exposed to the electrolytic nickel and gold plating processes. Heretofore, electroless nickel and gold plating processes were generally used on interconnect pads of PLGA modules.

Alternatively, or in addition, the PWB 110 may incorporate an enhanced contact metallurgy construction in accordance with the preferred embodiments of the present invention. For example, the noble metal plating techniques typically used for plating interconnect pads on PWBs are impractical for a PWB that requires a subcomposite laminate construction and/or one or more double-sided LGA sites. This obstacle is overcome in accordance with the preferred embodiments of the present invention by soldering preform contacts onto the interconnect pads of such PWBs. Hence, in accordance with the preferred embodiments of the present invention, electrolytic nickel and gold plated surfaces are provided on the interconnect pads of PWBs without exposing the interconnect pads to electrolytic nickel and gold plating processes. In accordance with the preferred embodiments of the present invention, only the preform contacts are exposed to the electrolytic nickel and gold plating processes.

Typically, it is preferable to use electrolytic nickel and gold plating processes to plate interconnect pads because these processes can provide a thick nickel plate (which may, for example, minimize diffusion of copper from the interconnect pad to the gold plating) and a thick, hard gold plating (which may, for example, provide wear and corrosion resistance). Hence, it is especially advantageous to use an enhanced contact metallurgy construction in accordance with the preferred embodiments of the present invention in service applications that involve high plug/unplug counts and/or in service applications that are performed in corrosive operating environments.

Referring again to FIG. 1, the printed wiring board assembly 100 also includes a frame 102, which is provided with one or more land grid array (LGA) interposers (shown in FIG. 2, for example) received in apertures that extend through the frame 102. Alternatively, or in addition, the one or more of the LGA interposers and the frame 102 may be contiguous and joined integrally together as a one-piece unit. The frame 102 and the one or more LGA interposers are sandwiched between the module substrate 108 and the PWB 110. The use of these conventional elements (e.g., the frame and the one or more LGA interposers), per se, is not necessary for purposes of the present invention, but is important in understanding an environment in which the present invention may be used. Although the preferred embodiments of the present invention are described herein within the context of a LGA connector that connects an electronic module to a PWB, one skilled in the art will appreciate that many variations are possible within the scope of the present invention. For example, an enhanced contact metallurgy construction in accordance with the present invention may be utilized in connecting any two substrates, such as connecting a ribbon substrate to any of a PWB, an electronic module, or another ribbon substrate.

A rectilinear heat sink 112 is connected to at least one bare die or module cap 114, which is/are in turn connected to module substrate 108. Heat sink 112 provides heat transfer functions, as is well known in the art. Electronic components, such as microprocessors and integrated circuits, must operate within certain specified temperature ranges to perform efficiently. Excessive heat degrades electronic component performance, reliability, life expectancy, and can even cause failure. Heat sinks, such as rectilinear heat sink 112, are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. The use of a heat sink, per se, is not necessary for purposes of the present invention, but is important in understanding an environment in which the present invention may be used.

Electronic components are generally packaged using electronic packages (i.e., modules) that include a module substrate, such as a ceramic or organic laminate module substrate, to which the electronic component is electronically connected. In some cases, the module includes a cap (i.e., capped modules) which seals the electronic component within the module. In other cases, the module does not include a cap (i.e., a bare die module). In the case of a capped module, a heat sink is typically attached with a thermal interface between a bottom surface of the heat sink and a top surface of the cap, and another thermal interface between a bottom surface of the cap and a top surface of the electronic component. In the case of a bare die module, a heat sink is typically attached with a thermal interface between a bottom surface of the heat sink and a top surface of the electronic component.

Referring again to FIG. 1, a rigid insulator 116 is disposed along the bottom surface of PWB 110 and is preferably fabricated from fiberglass reinforced epoxy resin. Rigid insulator 116 is urged upwards against PWB 110, and PWB 110 is thereby urged upward towards the frame 102 (as well as the one or more interposers received therein) and module substrate 108, by a clamping mechanism. Preferably, the clamping mechanism is a post/spring-plate type clamping mechanism 150 as shown in FIG. 1. Because such clamping mechanisms are conventional, the post/spring-plate type clamping mechanism 150 is only briefly described below. Additional details about post/spring-plate type clamping mechanisms may be found in U.S. Pat. No. 6,386,890 to Bhatt et al., the disclosure of which is incorporated by reference herein. One skilled in the art will appreciate that any of the many different types and configurations of clamping mechanisms known in the art may be used in lieu of the post/spring-plate type clamping mechanism 150 shown in FIG. 1.

In the embodiment shown in FIG. 1, clamping mechanism 150 includes a stiffener 152, which is preferably a metal or steel plate. An upward force is generated by a spring 154, which directs force upward against stiffener 152 through interaction with a spring-plate 156. It is preferred that spring-plate 156 is a square structure with about the same overall footprint as heat sink 112. Four cylindrical posts 158 are connected at the four corners of rectilinear heat sink 112 and disposed through cylindrical frame post holes 160, PWB post holes 162, post holes in insulator 116, stiffener post holes 164, and spring-plate post holes 166. Post mushroom heads 168 are formed at the ends of posts 158. The post mushroom heads 168 rest against spring-plate 156 and thereby prevent spring-plate 156 from moving downward.

Downward expansion or deflection forces from spring 154 are exerted directly upon spring-plate 156, which translates the forces through posts 158, heat sink 112, bare die or module cap 114 into module substrate 108, thereby forcing module substrate 108 downward until module substrate 108 comes into contact with and exerts force upon an upper surface of the frame 102 and the one or more interposers. For example, the upper surface of the frame 102 and the one or more interposers may include stops (shown in FIG. 3, for example) upon which the module substrate 108 comes into contact. Alternatively, or in addition, as discussed in more detail below, the module substrate 108 may include stops in the form of support projections extending from a permanent preform array carrier (shown in FIGS. 21-23, for example) upon which the upper surface of the frame 102 and/or the interposers come(s) into contact.

Similarly, force from spring 154 is also exerted upwards by spring 154 and translated through stiffener 152 and insulator 116 into PWB 110, forcing PWB 110 upwards until PWB 110 comes into contact with and exerts force upon a lower surface of the frame 102 and the one or more interposers. For example, the lower surface of the frame 102 and the one or more interposers may include stops (shown in FIG. 3) upon which the PWB 110 comes into contact. Accordingly, PWB 110 and module substrate 108 are forced toward each other with compressive forces upon the frame 102 and the one or more interposers disposed therebetween. Alternatively, or in addition, as discussed in more detail below, the PWB 110 may include stops in the form of support projections extending from a permanent preform array carrier upon which the lower surface of the frame 102 and/or the interposers come(s) into contact.

Spring-plate 156 also has a threaded screw 170 in the center of spring 154. When screw 170 is turned clockwise, its threads travel along corresponding thread grooves in a spring-plate screw hole 172 in spring-plate 156 and, accordingly, screw 170 moves upward toward and against stiffener 152. As screw 170 engages stiffener 152 and exerts force upward against it, corresponding relational force is exerted by the threads of screw 170 downward against the thread grooves in spring-plate 156. As illustrated above in the discussion of spring 154, the downward force exerted by screw 170 is translated by spring-plate 156, post mushroom heads 168, posts 158, heat sink 112 and the bare die or module cap 114 into module substrate 108, thereby forcing module substrate 108 downward until module substrate 108 (e.g., stops, if present) comes into contact with and exerts force against the upper surface (e.g., stops, if present) of the frame 102 and the one or more interposers. Similarly, upward force from screw 170 is translated through stiffener 152 and insulator 116 into PWB 110, forcing PWB 110 upwards until PWB 110 (e.g., stops, if present) comes into contact with and exerts force against the lower surface (e.g., stops, if present) of the frame 102 and the one or more interposers. Accordingly, after screw 170 is rotated clockwise into contact with stiffener 152, additional clockwise rotation of screw 170 results in increasing compressive force exerted by PWB 110 and module substrate 108 upon the frame 102 and the one or more interposers disposed therebetween.

Figure 2:
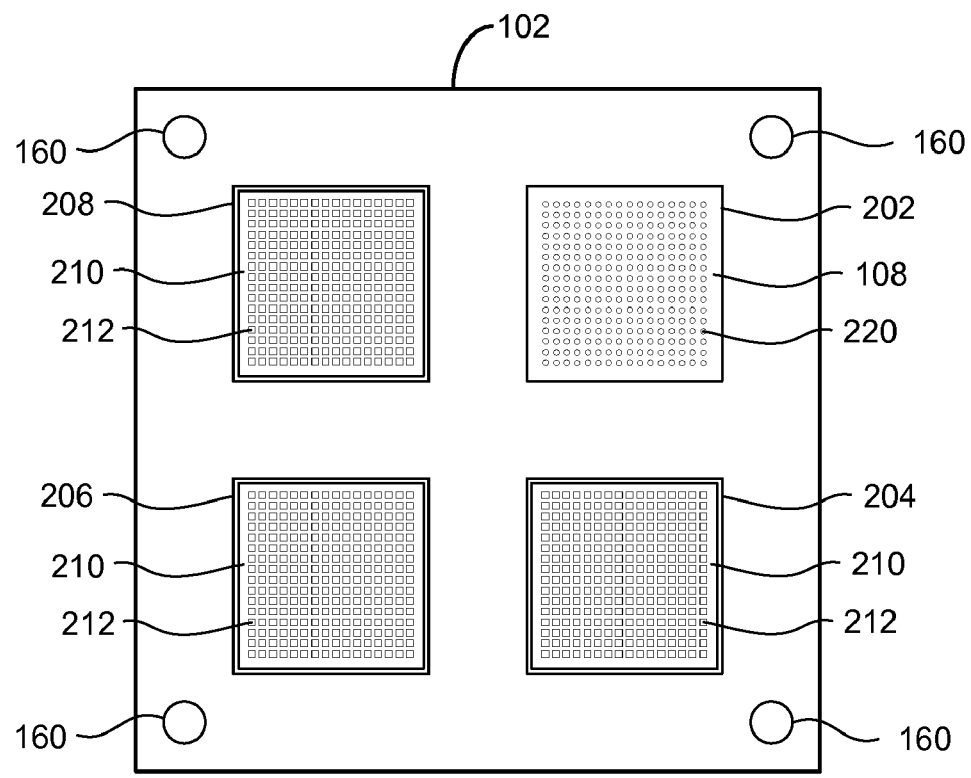
FIG. 2 is bottom perspective view of a frame utilized in the printed wiring board assembly (PWBA) shown in FIG. 1. The frame is shown with one land grid array (LGA) interposer removed to reveal a module substrate having an enhanced contact metallurgy construction in accordance with the preferred embodiments of the present invention.

FIG. 2 illustrates, in a bottom perspective view, the frame 102 shown in FIG. 1. As shown in FIG. 2, in accordance with the preferred embodiments of the invention, the frame 102 includes four apertures 202, 204, 206 and 208 arranged in quadrants, with each of the apertures 202, 204, 206 and 208 being configured to receive an LGA interposer 210 (only three of which are shown in FIG. 2). Each LGA interposer 210 has an array of spring-type contacts (shown in FIG. 3, for example) captured in holes 212. One of the LGA interposers 210 has been removed in FIG. 2 to reveal an array of contact pads 220 on the module substrate 108. The contact pads 220 employ an enhanced contact metallurgy construction in accordance with the preferred embodiments of the present invention. The frame 102 is constructed of non-conductive material. Typically, the frame 102 is a molded insulator or thin polymer insulator.

Those skilled in the art will appreciate that the invention may be implemented with any number and arrangement of apertures. Moreover, one or more of the apertures 202, 204, 206 and 208 may be omitted in favor of a frame structure that has an integral, one-piece construction which incorporates one or more LGA interposers in a contiguous fashion. Hence, a frame structure in accordance with the preferred embodiments of the invention generally includes a land grid array insulator body having a frame portion and one or more interposer portions, wherein the frame portion and the one or more interposer portions may be constructed separately or together as one-piece.

Typically, the apertures of a frame serve to align the LGA interposers received therein so that contacts of the interposer properly register with contacts of the PWB at the LGA site and corresponding contacts of the electronics module, either or both of which incorporate an enhanced contact metallurgy construction in accordance with the preferred embodiments of the present invention. Accordingly, such a frame is often referred to as an "alignment frame".

Figure 3:
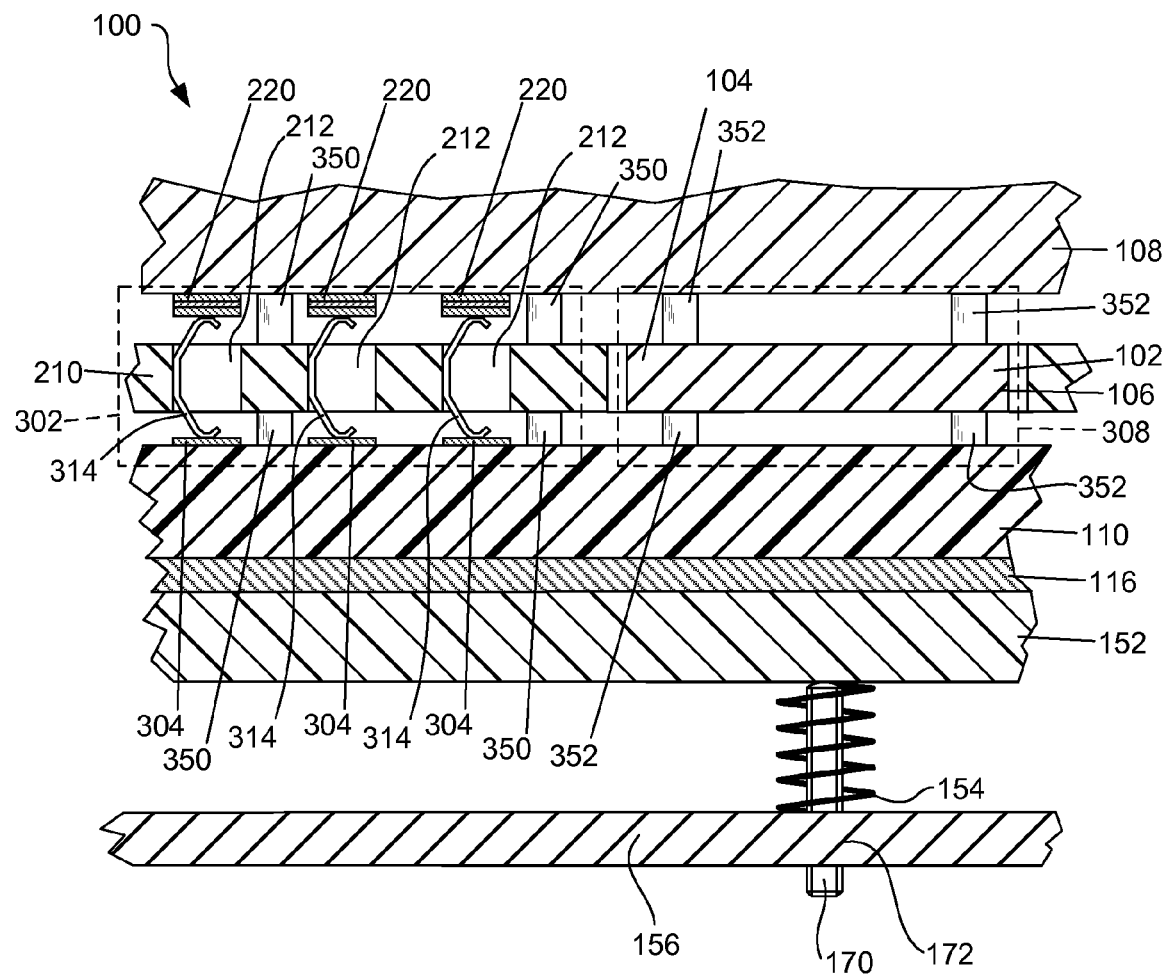
FIG. 3 is a partial, sectional view of the printed wiring board assembly (PWBA) of FIG. 1, taken along the section line indicated in FIG. 1.
Figure 4:
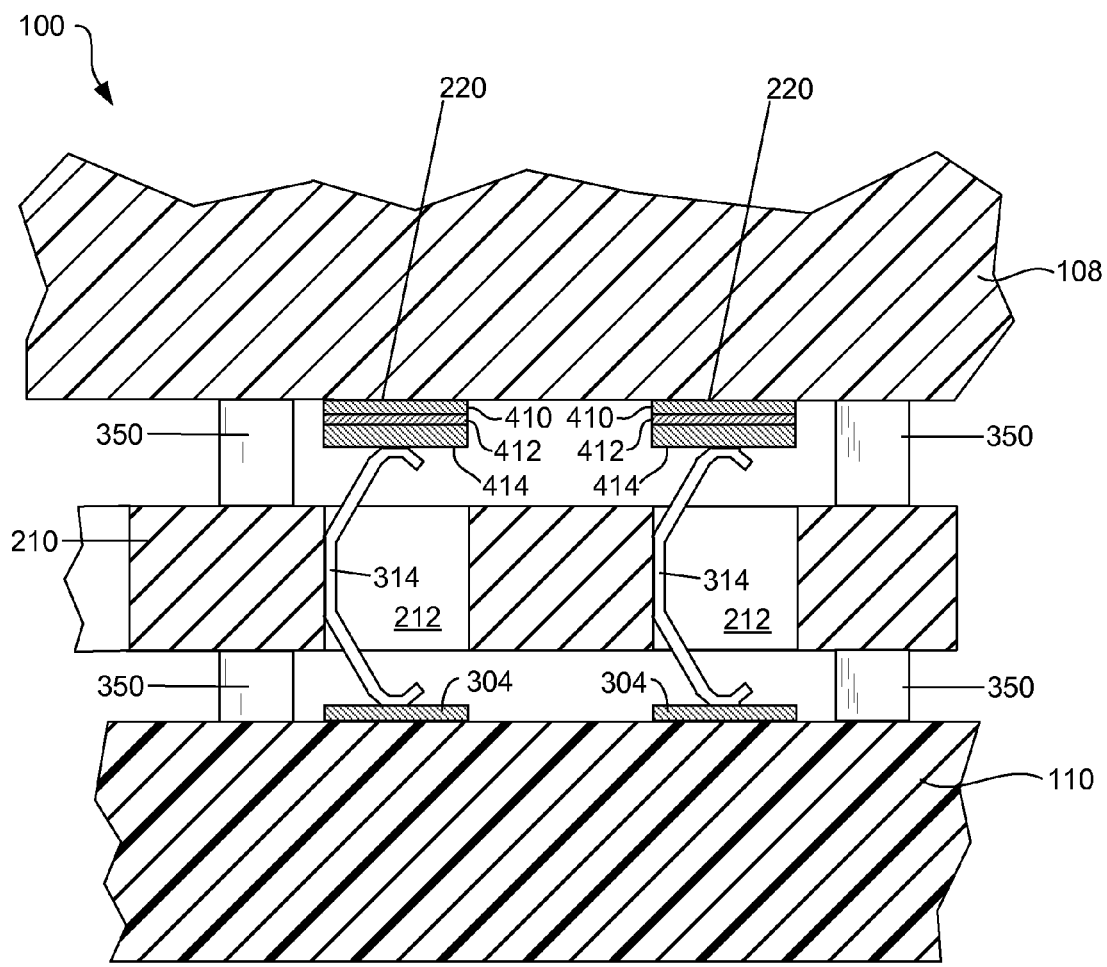
FIG. 4 is an enlarged partial, sectional view of the printed wiring board assembly (PWBA) of FIG. 3, in an area of a land grid array (LGA) interposer.
Figure 5:
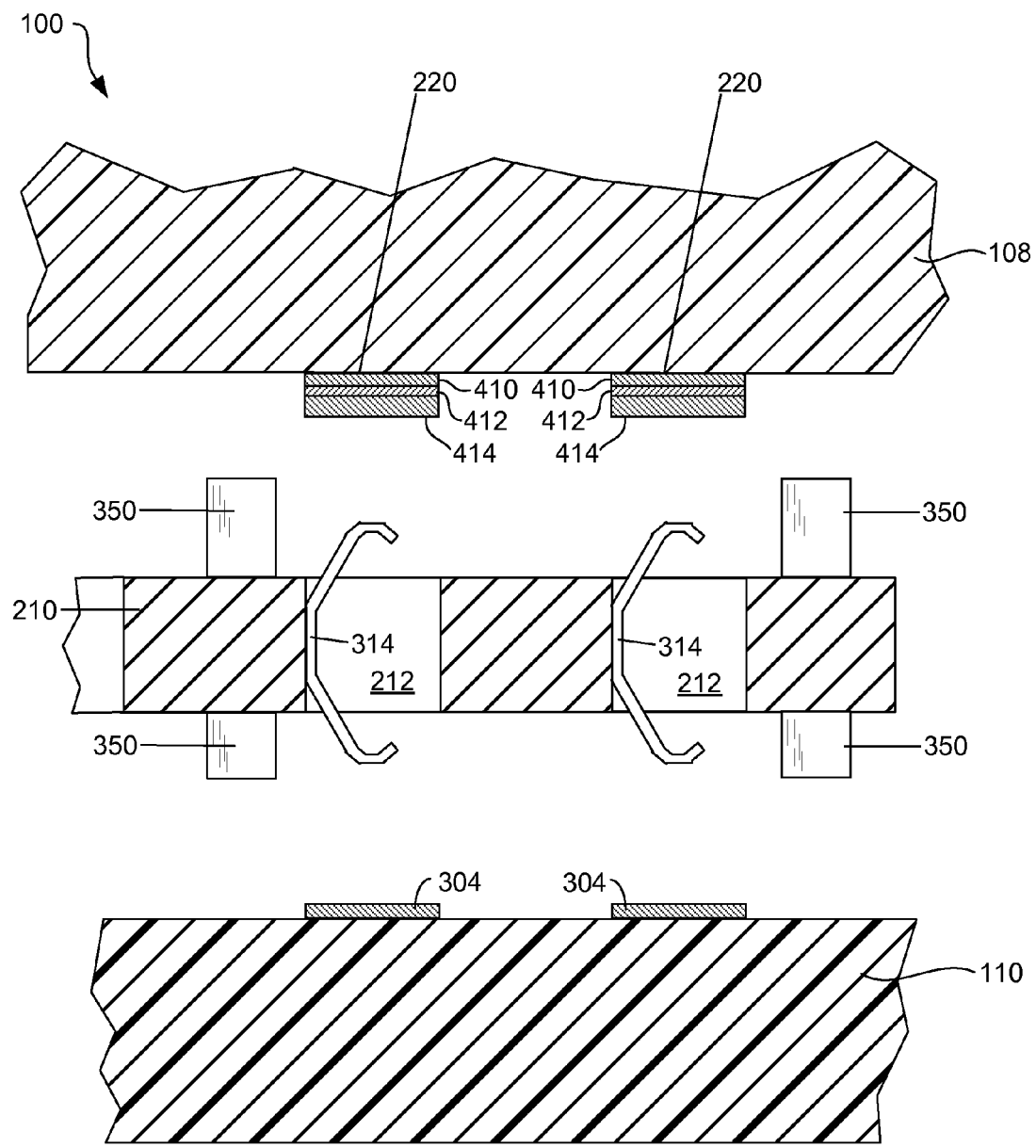
FIG. 5 is an unassembled version of the enlarged partial, sectional view of the printed wiring board assembly shown in FIG. 4.

Reference is now made to FIGS. 3-5. FIG. 3 illustrates, in a partial, sectional view, the printed wire board assembly 100 along the section line 3-3 of FIG. 1. More particularly, FIG. 3 shows a portion of a land grid array (LGA) site 302 comprising contact pads 304 of the PWB 110 and corresponding contact pads 220 of the module substrate 108 having an enhanced contact metallurgy construction in accordance with the preferred embodiments of the present, as well as an adjacent portion, outside the LGA site 302, of a frame site 308. The contact pads 220 of the module substrate 108 and the contact pads 304 of the PWB 110 make electrical contact with each other through spring-type LGA contacts 314 captured in holes 212 of the LGA interposer 210 at the LGA site 302. Alternatively, or in addition, the contact pads 304 of the PWB 110 may have an enhanced contact metallurgy construction in accordance with the preferred embodiments of the present invention (i.e., in lieu of, or in addition to, an enhanced contact metallurgy construction of the contact pads 220 of the module substrate 108 as shown in FIG. 3).

Typically, an LGA interposer, such as the LGA interposer 210, is a molded insulator or thin polymer insulator. A plurality of LGA contacts, such as the spring-type LGA contacts 314, typically are press-fit into holes drilled in the molded or thin polymer insulator. In general, these LGA contacts may be of a press-fit design, surface mount design, and/or friction fit design (e.g., waded wire buttons or molded metal filled elastomer contacts).

The contacts 314 used in the LGA interposer 210 are conventional. Typically, these contacts are single layer contacts. However, at least some of the contacts 314 may have a plurality of layers, such as bimetallic contacts. Generally, single layer contacts use a monolithic alloy (e.g., beryllium copper alloys, Cu—Ni—Si and similar Cu based alloys) overplated with a noble metal (e.g., Au). On the other hand, multi-layer contacts generally consist of metallurgically bonded clad metal sheets; a clad metal inlay (e.g., Ag, Au, Pd or Pt; or alloys of Au, Pd and/or Pt with Ag, Ni or Cu) on a base metal carrier (e.g., stainless steel, highly alloyed Cu—Ni—Si, or other high strength formable alloy); or a highly conductive core (e.g., Ag, Au, Pd or Pt, or alloys of Au, Pd and Pt with Ag, Ni or Cu) clad to structural metal layers (e.g., stainless steel, beryllium copper alloys, highly alloyed Cu—Ni—Si, or other high strength formable alloy). Multi-layered contacts may also be overplated with a noble metal (e.g., Au). Examples of tri-clad contacts include contacts of stainless steel/Ag/beryllium copper and contacts of stainless steel/Ag/stainless steel.

The spring-type LGA contacts 314 shown in FIGS. 3-5 are exemplary. Those skilled in the art will appreciate that the invention may be implemented with LGA contacts having a different configuration than that shown in FIG. 3. Moreover, those skilled in the art will appreciate that the invention may be implemented with other types of contacts, including hybrid contacts, leaf-spring type contacts, resilient wire bundle contacts, molded metal filled elastomer contacts, press-fit pin contacts, surface mounted technology (SMT) contacts, and the like.

FIG. 4 illustrates, in an enlarged partial, sectional view, the printed wiring board assembly 100 in an area of one of the LGA interposers 210. FIG. 5 is an unassembled version of FIG. 4. That is, FIG. 5 illustrates, in an enlarged partial, sectional view, the printed wiring board assembly 100 in an area of one of the LGA interposers 210 in an unassembled state. As best seen in FIGS. 4 and 5, each contact pad 220 of the module substrate 108 includes a metal pad 410, a solder layer 412 and a preform contact 414. The metal pad 410 is provided on the module substrate 108 using conventional techniques. Preferably, the metal pad 410 is a highly conductive metal (e.g., Cu or a Cu based alloy) that readily accepts a solder joint. Although not necessary, the metal pad 410 may be overplated with a noble metal (e.g., Au). However, such a noble metal overplating, if present, must be relatively thin (e.g., gold flash) so as not to introduce soldering issues.

The solder layer 412 attaches the preform contact 414 to the metal pad 410 on the module substrate 108. In accordance with the preferred embodiments of the present invention, as discussed in more detail below (with reference to FIGS. 6-7, for example), the preform contact 414 includes a metal preform base (e.g., Cu or a Cu based alloy), an electrolytic non-noble underplating (e.g., Ni or an Ni based alloy), and an electrolytic noble metal plating (e.g., Au or an Au based alloy). The metal preform base-side of the preform contact 414 is soldered to the metal pad 410 on the module substrate 108. Preferably, the electrolytic non-noble metal underplating is 80-400 microinches thick to provide an enhanced diffusion barrier, and the electrolytic noble metal plating is 30-60 microinches thick and incorporates one or more hardening agents (e.g., Fe, Co, Ni) to provide enhanced wear and corrosion resistance.

Referring now temporarily to FIG. 3, a plurality of stops 350 may be included between the interposer 210 and the module substrate 108 and/or between the interposer 210 and the PWB 110. Similarly, a plurality of stops 352 may be included between the frame 102 and the module substrate 108 and/or between the frame 102 and the PWB 110. However, some or all of the stops 350 and/or some or all of the stops 352 may be omitted. For example, in the case of hybrid contacts, the stops may be omitted between the interposer and the PWB, and between the frame and the PWB. Also, in the case of resilient wire bundle contacts, the stops may be omitted entirely.

The stops 350, if present, preferably project from the interposer 210; whereas, the stops 352, if present, preferably project from the frame 102. Alternatively, or in addition, at least some of the stops, if present, may project from a permanent preform array carrier (described below with reference to FIGS. 21-23, for example) to which the preform contacts are attached.

Figure 6:
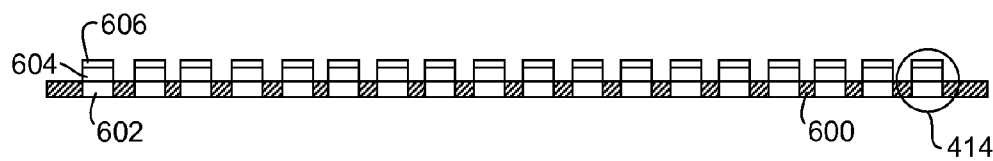
FIG. 6 is a sectional view of a plurality of preform contacts each provided in a temporary preform array carrier in accordance with the preferred embodiments of the present invention.
Figure 7:
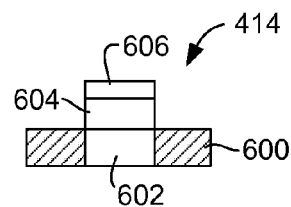
FIG. 7 is an enlarged partial, sectional view of one of the preform contacts provided in the temporary preform array carrier shown in FIG. 6.

FIG. 6 is a sectional view of a plurality of preform contacts 414 each provided in a temporary preform array carrier 600 in accordance with the preferred embodiments of the present invention. FIG. 7 is an enlarged partial, sectional view of one of the preform contacts 414 provided in the temporary preform carrier 600 shown in FIG. 6. The temporary preform carrier 600, which is preferably temporary but may be permanent, is a molded insulator or thin polymer insulator. For example, the temporary preform carrier 600 may be a polyimide film, such as Kapton® polyimide film, available from DuPont Electronic Technologies, Circleville, Ohio, having holes punched therein to accommodate the preform contacts 414.

In accordance with the preferred embodiments of the present invention, each preform contact 414 includes a metal preform base 602 (e.g., Cu or a Cu based alloy), an electrolytic non-noble underplating 604 (e.g., Ni or a Ni based alloy), and an electrolytic noble metal plating 606 (e.g., Au or an Au based alloy). Preferably, the electrolytic non-noble metal underplating 604 is 80-400 microinches thick to provide an enhanced diffusion barrier, and the electrolytic noble metal plating 606 is 30-60 microinches thick and incorporates one or more hardening agents (e.g., Fe, Co, Ni) to provide enhanced wear and corrosion resistance.

In an alternative embodiment, the metal preform base 602 of the preform contact 414 may be made fabricated from a metal (e.g., Ni or a Ni based alloy) that does not present contamination issues unlike Cu or a Cu based alloy. This obviates the need for a diffusion barrier between the metal preform base 602 and the electrolytic noble metal plating 606. Hence, the electrolytic non-noble underplating 604 may be omitted in this alternative embodiment in favor of directly providing the electrolytic noble metal plating 606 (e.g., Au or an Au based alloy) on the metal preform base 602.

In accordance with the preferred embodiments of the present invention, each preform contact 414 is fabricated by subjecting a metal preform base 602 to a conventional electrolytic Ni plating process to provide an electrolytic Ni underplating 604 having a thickness of approximately 200 microinches, which is then subjected to a conventional electrolytic Au plating process that incorporates one or more hardening agents to provide an electrolytic hard, Au plating 606 having a thickness of at least 40 microinches. Also in accordance with the preferred embodiments of the present invention, once the electrolytic plating processes are complete, the base portion of each preform contact 414 (i.e., the end of the preform contact that includes the metal preform base 602) is inserted and retained in a punched Kapton® polyimide film 600. Preferably, the base portion of each preform contact 414 and the holes punched in the temporary preform carrier 600 are dimensioned and/or configured to facilitate an interference-fit therebetween sufficient to retain the preform contacts 414 in the temporary preform carrier 600.

In an alternative to an interference-fit retention mechanism for retaining the preform contacts 414 in the temporary preform carrier 600, the preform contacts 414 may be adhered to an preform array carrier using an adhesive such as a pressure sensitive adhesive (PSA), for example. An example of such an alternative embodiment is described below with reference to FIGS. 15-19.

In another alternative to an interference-fit retention mechanism for retaining the preform contacts 414 in the temporary preform carrier 600, the preform contacts 414 may be mechanically affixed or molded into a permanent preform array carrier. An example of such an alternative embodiment is described below with reference to FIGS. 20-23.

Figure 8:
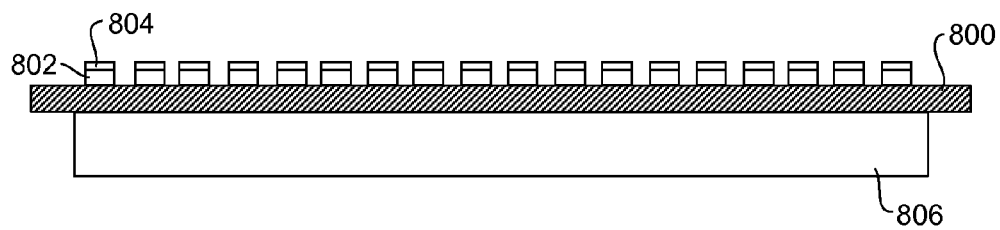
FIG. 8 is sectional view of a plastic land grid array (PLGA) module carrier having a plurality of metal pads each stenciled with a solder paste in accordance with the preferred embodiments of the present invention.
Figure 9:
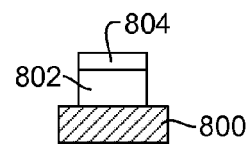
FIG. 9 is an enlarged partial, sectional view of one of the metal pads on the plastic land grid array (PLGA) module carrier shown in FIG. 8.

FIG. 8 is sectional view of a plastic land grid array (PLGA) module carrier 800 having a plurality of metal pads 802 each stenciled with a solder paste 804 in accordance with the preferred embodiments of the present invention. FIG. 9 is an enlarged partial, sectional view of one of the metal pads 802 on the plastic land grid array (PLGA) module carrier 800 shown in FIG. 8. The metal pads 802 on the upper side of the PLGA module carrier 800 (as viewed in FIG. 8) are electrically connected to a chip 806 mounted on the lower side of the PLGA module carrier 800 (as viewed in FIG. 8). The PLGA module carrier 800, metal pads 802, the solder paste 804, and the chip 806 shown in FIGS. 8 and 9 respectively correspond with the module substrate 108, the metal pads 410, the solder layer 412, and the bare die or module cap 114 shown in FIGS. 4 and 5.

Typically, a plurality of electrically conductive vias (not shown) pass through the PLGA module carrier 800 from the metal pads 802 to terminals or pads (not shown) on the lower side of the PLGA module carrier 800 (as viewed in FIG. 8). Controlled collapse chip connection (C4) solder joints (not shown) are typically used to electrically connect these terminals or pads (not shown) on the lower side of the PLGA module carrier 800 (as viewed in FIG. 8) with corresponding terminal or pads (not shown) on the mounting surface of the chip 806. C4 solder joints are typically disposed on the mounting surface of the chip in an array of minute solder balls (e.g., on the order of 100 μm diameter and 200 μm pitch). These solder balls (not shown), which are typically lead (Pb)-containing solder, are reflowed to join (i.e., electrically and mechanically) the terminals or pads (not shown) on the mounting surface of the chip 806 with corresponding terminals or pads (not shown) on the PLGA module carrier 800.

The chip 806 may be, for example, a central processor unit (CPU), memory module, application-specific integrated circuit (ASIC), or other integrated circuit. Typically, the chip 806 is a flip-chip, which is a semiconductor or die having an array of spaced-apart terminals or pads on its base to provide base-down mounting of the flip-chip to the module substrate.

The metal pads 802 are provided on the PLGA module carrier 400 using conventional techniques. Preferably, each of the metal pads 802 is a highly conductive metal (e.g., Cu or a Cu based alloy) that readily accepts a solder joint. Although not necessary, each of the metal pads 802 may be overplated with a noble metal (e.g., Au). However, such a noble metal overplating, if present, must be relatively thin (e.g., gold flash) so as not to introduce soldering issues.

The metal pads 802 are stenciled with the solder paste 804 using conventional stenciling techniques. For example, a conventional screen-printing technique may be utilized wherein a squeegee is used to force a solder paste through holes in a screen (e.g., stainless steel or polyester) and deposit the solder paste on the metal pads 802. The solder paste is a conventional mixture of solder particles and flux. As is well known, flux is a reducing agent that is utilized to improve the electrical connection by removing impurities, such as oxidized metals, from points of contact. The solder paste may be, for example, a mixture of lead (Pb)-containing solder particles (e.g., spheres of 60/40 Sn/Pb, 63/37 Sn/Pb, or other alloy of tin and lead) and/or lead (Pb)-free solder particles (e.g., spheres of SnAgCu) and flux (e.g., a rosin flux or a water-soluble flux).

Figure 10:
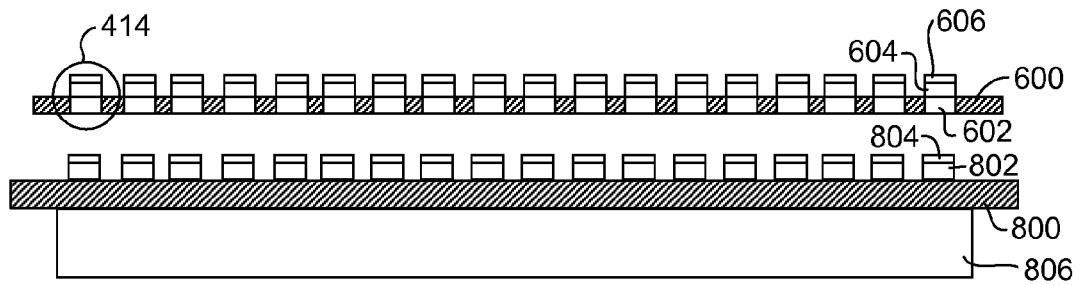
FIG. 10 is a sectional view of the preform contacts provided in the temporary preform array carrier shown in FIG. 6 disposed above and in alignment with the solder paste/metal pads on the plastic land grid array (PLGA) module carrier shown in FIG. 8. These components are subsequently brought into contact and soldered together to form the assembly shown in FIG. 11.
Figure 11:
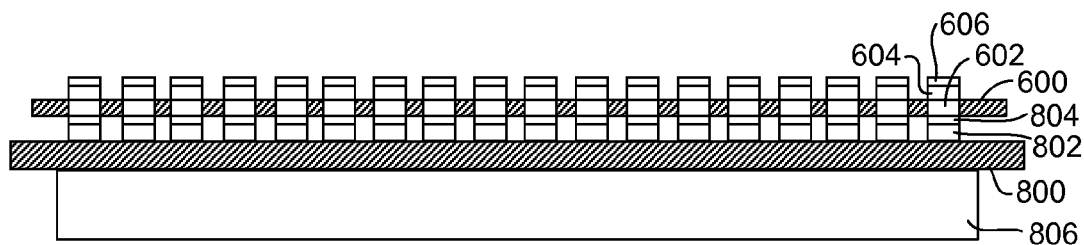
FIG. 11 is a sectional view of an assembly in which the preform contacts provided in the temporary preform array carrier shown in FIG. 6 are attached to the solder paste/metal pads on the plastic land grid array (PLGA) module carrier shown in FIG. 8 by reflowing the solder paste in accordance with the preferred embodiments of the present invention.
Figure 12:
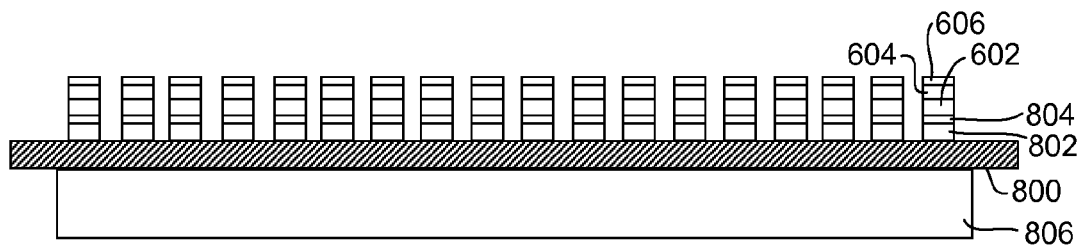
FIG. 12 is a sectional view of an assembly identical to that shown in FIG. 11, except the temporary preform array carrier has been removed from the preform contacts in accordance with the preferred embodiments of the present invention.

Referring now to FIGS. 10-12, there is depicted an exemplary method for fabricating a plastic land grid array (PLGA) module with an enhanced contact metallurgy construction in accordance with the preferred embodiments of the present invention. FIG. 10 is a sectional view of the preform contacts 414 provided in the temporary preform carrier 600 shown in FIG. 6 disposed above and in alignment with the solder paste 804/metal pads 802 on the plastic land grid array (PLGA) module carrier 800 shown in FIG. 8. These components are subsequently brought into contact and soldered together to form the assembly shown in FIG. 11.

FIG. 11 is a sectional view of an assembly in which the preform contacts 414 provided in the temporary preform carrier 600 are attached to the solder paste 804/metal pads 802 on the plastic land grid array (PLGA) module carrier 800 by reflowing the solder paste 804 in accordance with the preferred embodiments of the present invention. Preferably, after the solder paste 804 is reflowed and the preform contacts 424 are securely attached to the solder paste 804/metal pads 802, the temporary preform carrier 600 is removed to form the assembly shown in FIG. 12.

FIG. 12 is a sectional view of an assembly identical to that shown in FIG. 11, except the temporary preform carrier 600 has been removed from the preform contacts 414 in accordance with the preferred embodiments of the present invention. The temporary preform carrier 600 may be, for example, peeled from the preform contacts 414.

Figure 13:
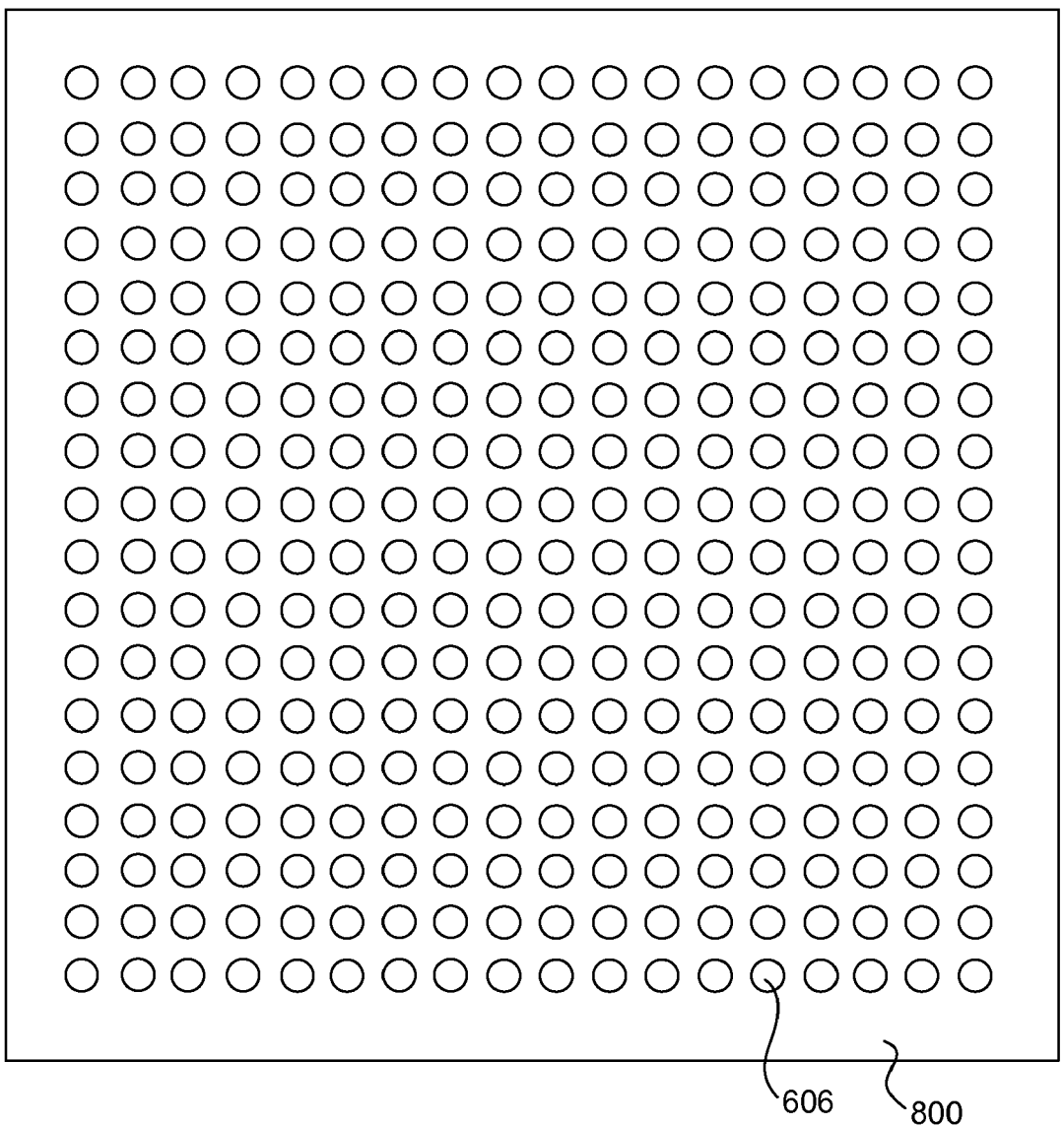
FIG. 13 is a top perspective view of the assembly shown in FIG. 12.

FIG. 13 is a top perspective view of the assembly shown in FIG. 12. In accordance with the preferred embodiments of the present invention, the PLGA module carrier 800 presents interconnect pads each having a surface finish of an electrolytic noble metal plating 606 (e.g., Au or an Au based alloy) having a thickness of 30-60 microinches and incorporating one or more hardening agents (e.g., Fe, Co, Ni) to provide enhanced wear and corrosion resistance. This compares favorably with conventional interconnect pads of PLGA modules, which typically have a surface finish of an electroless Au plating that is a relatively thin (typically, ≦15 microinches) and typically porous. This surface finish of conventional interconnect pads of PLGA modules can be especially problematic in service applications that involve high plug/unplug counts and/or in service applications that are performed in corrosive operating environments.

Referring temporarily back to FIGS. 8-9, in the embodiment just described the metal pads 802 on the PLGA module carrier 800 are stenciled with the solder paste 804. Alternatively, or in addition, solder paste may be applied to the base portion of each preform contact 414 (i.e., the lower surface of the metal preform base 602 as viewed in FIGS. 6-7) retained in the temporary preform carrier 600 using screen-printing techniques.

Figure 14:
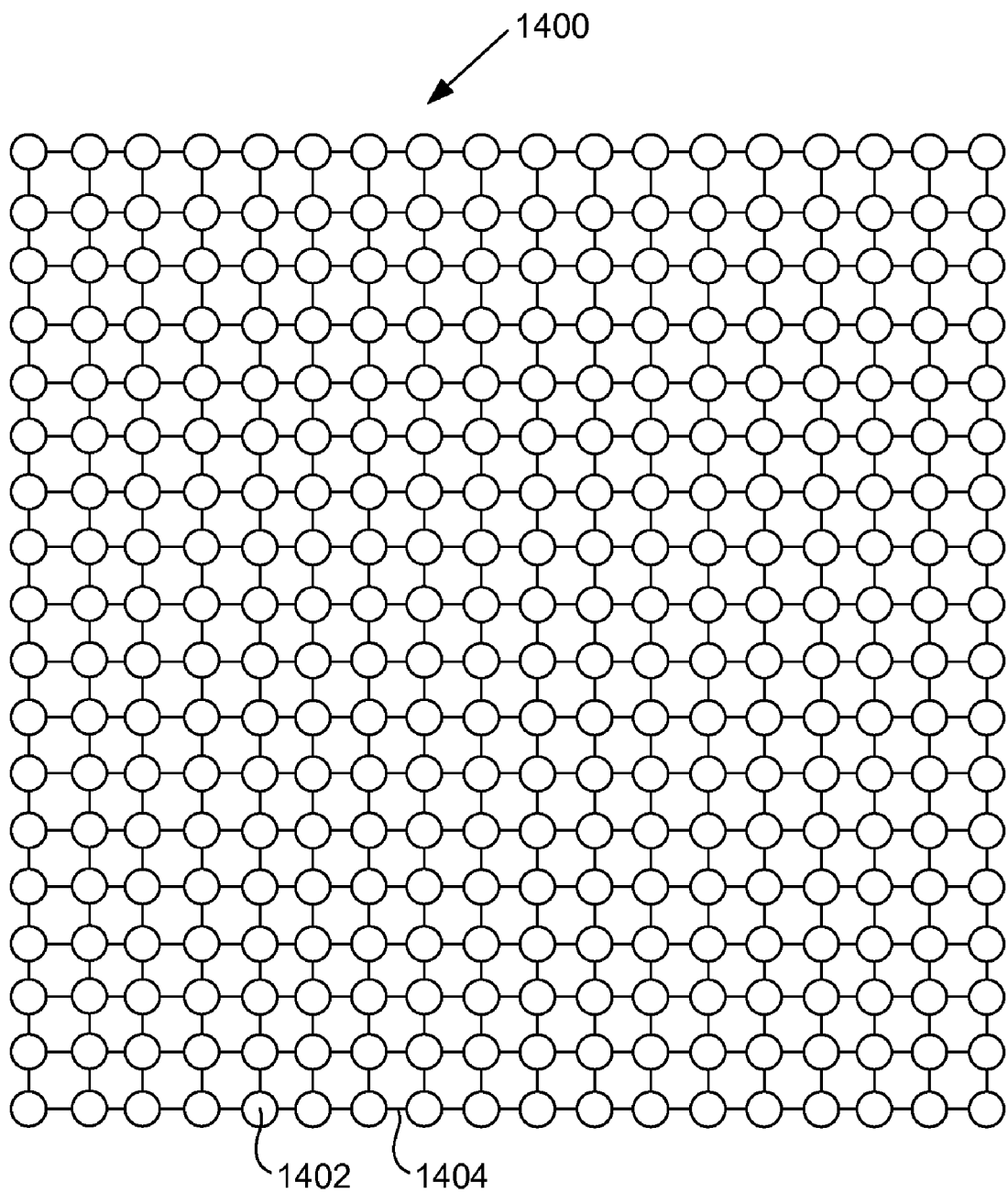
FIG. 14 is a top perspective view of a fluxed solder preform in accordance with the preferred embodiments of the present invention.

In an alternative to using screen-printing techniques to apply solder paste, solder may instead be applied to the metal pads on the PLGA module carrier and/or the base portion of each preform contact retained in the preform array carrier through the utilization of a fluxed solder preform. FIG. 14 is a top perspective view of a fluxed solder preform 1400 in accordance with the preferred embodiments of the present invention. The fluxed solder preform 1400 includes an array of dots 1402 connected by narrow strips 1404. The array of dots 1402 and the narrow strips 1404 are configured so that the array of dots 1404 will align with the metal pads on the PLGA module carrier and/or the base portions of the preform contacts retained in the preform array carrier. Preferably, the dots 1402 and the narrow strips 1404 are cut (e.g., stamped) from a sheet of solder paste, a sheet of solder that incorporates flux (e.g., a flux core), or a sheet of solder coated with flux. For example, the dots 1402 and the narrow strips 1404 may be stamped from a sheet of lead (Pb)-containing solder (e.g., 60/40 Sn/Pb, 63/37 Sn/Pb, or other alloy of tin and lead) and/or lead (Pb)-free solder (e.g., spheres of SnAgCu) having a flux core (e.g., a rosin flux or a water-soluble flux).

Preferably, the fluxed solder preform 1400 is applied to the metal pads on the PLGA module carrier. Then, in steps analogous to those shown in FIGS. 10-11, the preform contacts provided in the preform array carrier are brought into alignment with and attached to the fluxed solder preform 1400/metal pads on the PLGA module carrier by reflowing the fluxed solder preform 1400. As the fluxed solder preform 1400 reflows, surface tension draws the narrow strips 1404 of the into the dots 1402. The temporary preform array carrier may then be removed from the preform contacts. Alternatively, rather than applying the fluxed solder preform 1400 to the metal pads on the PLGA module carrier, the fluxed solder preform 1400 may be applied to the base portions of the preform contacts retained in the preform array carrier.

As mentioned above, as an alternative to an interference-fit retention mechanism for retaining the preform contacts 414 in the temporary preform carrier 600, the preform contacts 414 may be adhered to a temporary preform array carrier using an adhesive such as pressure sensitive adhesive (PSA), for example. An example of such an alternative embodiment is described below with reference to FIGS. 15-19.

Figure 15:
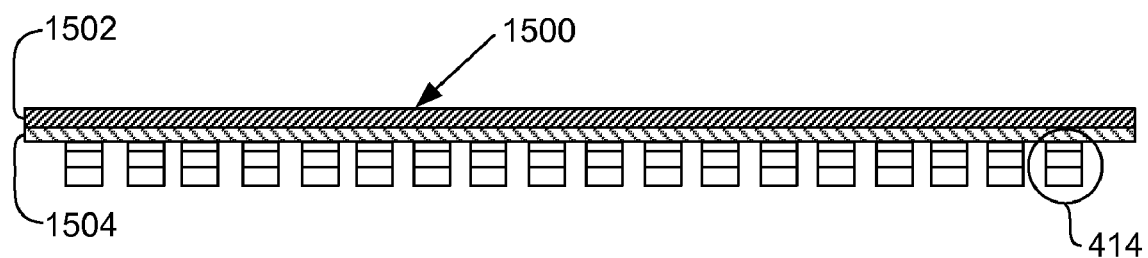
FIG. 15 is a sectional view of a plurality of preform contacts each adhered to a temporary preform array carrier in accordance with the preferred embodiments of the present invention.
Figure 16:
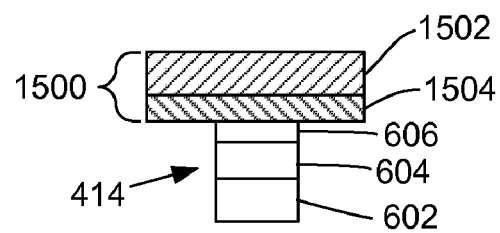
FIG. 16 is an enlarged partial, sectional view of one of the preform contacts adhered to the temporary preform array carrier shown in FIG. 15.

FIG. 15 is a sectional view of a plurality of preform contacts 414 each adhered to a temporary preform array carrier 1500 in accordance with the preferred embodiments of the present invention. FIG. 16 is an enlarged partial, sectional view of one of the preform contacts 414 adhered to the temporary preform array carrier 1500 shown in FIG. 15. The preform contacts 414 shown in FIGS. 15-16 are identical to those shown in FIGS. 6-7. The preform array carrier 1500, which is temporary, includes a backing sheet 1502 and an adhesive layer 1504. Preferably, the adhesive layer 1504 is a pressure sensitive adhesive (PSA). The top portion of each preform contact 414 (i.e., the end of the preform contact that includes the electrolytic noble metal plating 606) is adhered to the temporary preform array carrier 1500 by the adhesive layer 1504.

Independent of the contact carrier structure used, in addition to accommodating contacts for solder assembly, the permanent or temporary contact carriers preferably also serve to inhibit extraneous solder wicking onto noble metal plated contact surfaces.

Figure 17:
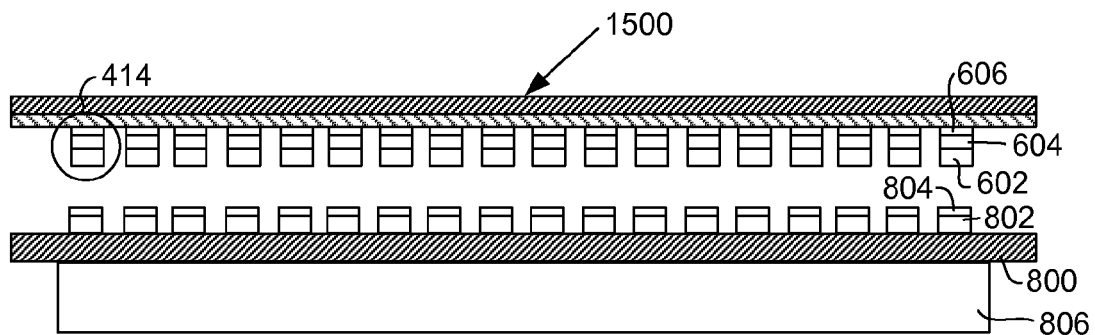
FIG. 17 is a sectional view of the preform contacts adhered to the temporary preform array carrier shown in FIG. 15 disposed above and in alignment with the solder paste/metal pads on the plastic land grid array (PLGA) module carrier shown in FIG. 8. These components are subsequently brought into contact with each other and soldered together to form the assembly shown in FIG. 18.
Figure 18:
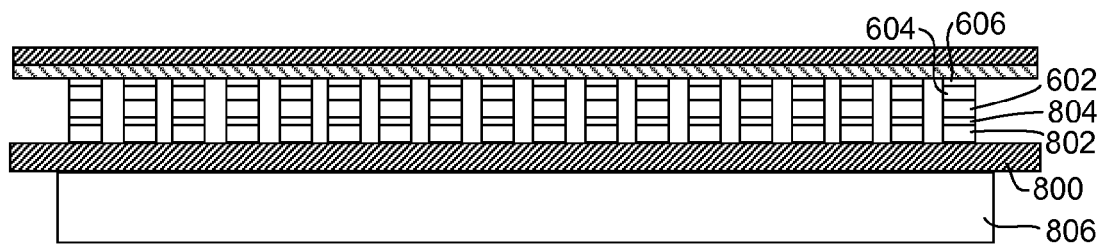
FIG. 18 is a sectional view of an assembly in which the preform contacts adhered to the temporary preform array carrier shown in FIG. 15 are attached to the solder paste/metal pads on the plastic land grid array (PLGA) module carrier shown in FIG. 8 by reflowing the solder paste in accordance with the preferred embodiments of the present invention.
Figure 19:
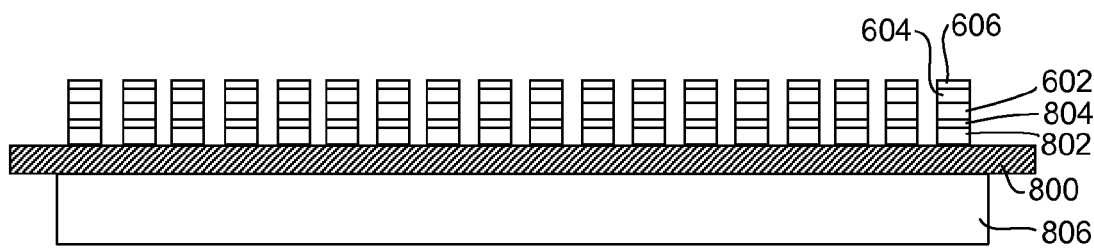
FIG. 19 is a sectional view of an assembly identical to that shown in FIG. 18, except the temporary preform array carrier has been removed from the preform contacts in accordance with the preferred embodiments of the present invention.

Referring now to FIGS. 17-19, there is depicted an exemplary method for fabricating a plastic land grid array (PLGA) module with an enhanced contact metallurgy construction in accordance with the preferred embodiments of the present invention. FIG. 17 is a sectional view of the preform contacts 414 adhered to the temporary preform array carrier 1500 shown in FIG. 15 disposed above and in alignment with the solder paste 804/metal pads 802 on the plastic land grid array (PLGA) module carrier 800 shown in FIG. 8. These components are subsequently brought into contact with each other and soldered together to form the assembly shown in FIG. 18.

FIG. 18 is a sectional view of an assembly in which the preform contacts 414 adhered to the temporary preform array carrier 1500 are attached to the solder paste 804/metal pads 802 on the plastic land grid array (PLGA) module carrier 800 by reflowing the solder paste 804 in accordance with the preferred embodiments of the present invention. After the solder paste 804 is reflowed and the preform contacts 414 are securely attached to the solder paste 804/metal pads 802, the temporary preform array carrier 1500 is removed to form the assembly shown in FIG. 19.

FIG. 19 is a sectional view of an assembly identical to that shown in FIG. 18, except the temporary preform array carrier 1500 has been removed from the preform contacts 414 in accordance with the preferred embodiments of the present invention. Preferably, this is accomplished by peeling the temporary preform array carrier 1500 away from the preform contacts 414.

As mentioned above, as another alternative to an interference-fit retention mechanism for retaining the preform contacts 414 in the temporary preform carrier 600, the preform contacts 414 may be mechanically affixed or molded into a permanent preform array carrier. An example of such an alternative embodiment is described below with reference to FIGS. 20-23.

Figure 20:
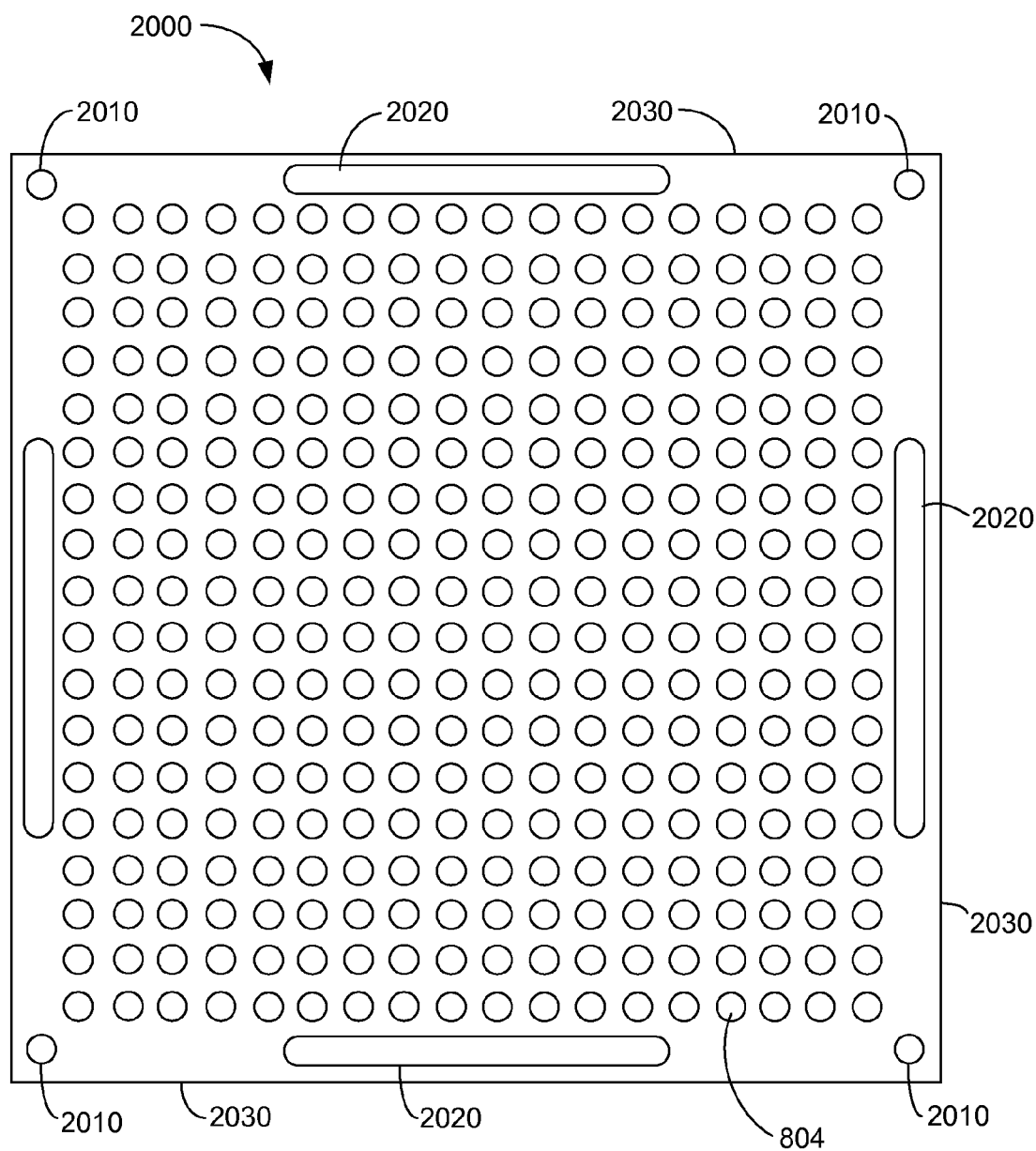
FIG. 20 is a bottom perspective view of a plastic land grid array (PLGA) module carrier having plurality of alignment features, as well as a plurality of metal pads each stenciled with a solder paste in accordance with the preferred embodiments of the present invention.

FIG. 20 is a bottom perspective view of a plastic land grid array (PLGA) module carrier 2000 having plurality of alignment features, as well as a plurality of metal pads 802 (shown in FIGS. 22-23) each stenciled with a solder paste 804 in accordance with the preferred embodiments of the present invention. The alignment features on the PLGA module carrier 2000 shown in FIG. 20, which are illustrative of various alignment features that may be used in accordance with the preferred embodiments of the present invention, include four post holes 2010, four peripheral slits 2020, and four peripheral edges 2030. The PLGA module carrier 2000 shown in FIG. 20 corresponds to the PLGA module carrier 800 shown in FIG. 8 but for these alignment features. The solder paste 804/metal pads 802 shown in FIG. 20 are identical to solder paste 804/metal pads 802 shown in FIGS. 8-9.

Figure 21:
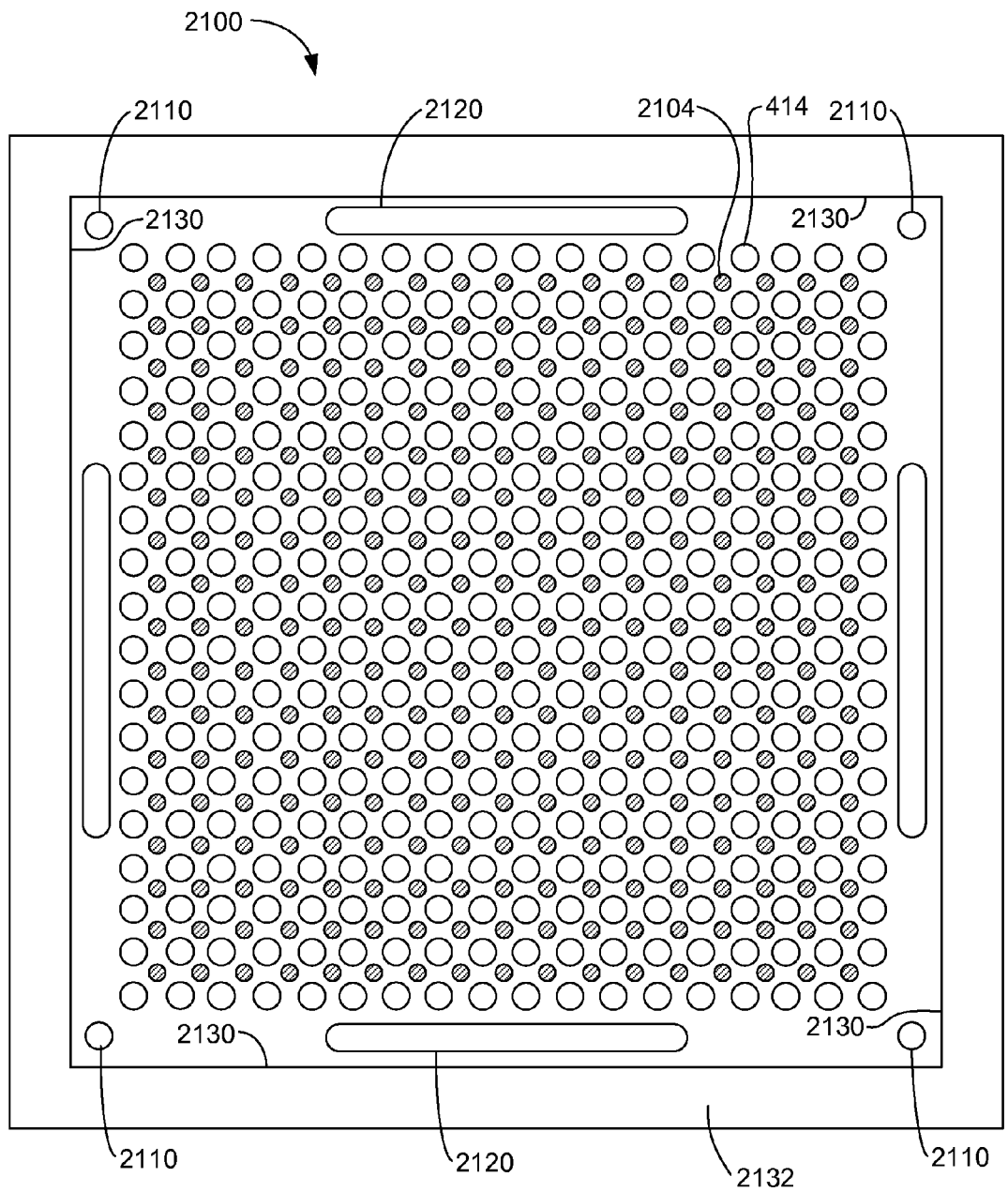
FIG. 21 is a top perspective view of a permanent preform array carrier having plurality of support projections and alignment features, as well as a plurality of preform contacts provided therein in accordance with the preferred embodiments of the present invention.

FIG. 21 is a top perspective view of a permanent preform array carrier 2100 having plurality of support projections 2104 and alignment features, as well as a plurality of preform contacts 414 provided therein in accordance with the preferred embodiments of the present invention. The preform contacts 414 shown in FIG. 21 are identical with the preform contacts 414 shown in FIG. 406. The alignment features of the permanent preform array carrier 2100 shown in FIG. 21, which are illustrative of various alignment features that may be used in accordance with the preferred embodiments of the present invention, include four post holes 2110, four peripheral slits 2120, and four interior edges 2130 of a peripheral frame 2132. In accordance with the preferred embodiments of the present invention, the support projections 2104 and the preform contacts 414 are mechanically affixed or molded into the permanent preform array carrier 2100. The support projections 2104, which are preferably non-conductive high-temperature plastic, are positioned between adjacent preform contacts 414 and project from at least one surface of the permanent preform array carrier 2100. Alternatively, or in addition, one skilled in the art will appreciate that support projections may be positioned at other locations such as along a peripheral portion of the permanent preform array carrier 2100, e.g., in the space between the preform contacts 414 and the peripheral frame 2132. The peripheral frame 2132, which is preferably non-conductive high-temperature plastic, is attached to (e.g., by adhesive) the peripheral edge of the permanent preform array carrier 2100.

Preferably, the permanent preform array carrier 2100 is a non-conductive high-temperature plastic such as a molded liquid crystal polymer (LCP), polyimide (PI), or polyetherimide (PEI). For example, the permanent preform array carrier 2100 may be Kapton® polyimide, available from DuPont Electronic Technologies, Centerville, Ohio, or Ultem® polyetherimide, available from SABIC Innovative Plastics, Pittsfield, Mass. In an alternative embodiment, the permanent preform array carrier 2100 support projections 2104, the peripheral frame 2132 may be integrally formed as a unitary, one-piece unit.

The alignment features of the PLGA module carrier 2000 (i.e., the post holes 2010, the peripheral slits 2020, and the peripheral edges 2030) are aligned with the corresponding alignment features of the permanent preform array carrier 2100 (i.e., the post holes 2110, the peripheral slits 2120, and the interior edges 2130 of the peripheral frame 2132) to precisely align the solder paste 804/metal pads 802 on the PLGA module carrier 2000 with the preform contacts 414 provided in the permanent preform array carrier 2100.

Figure 22:
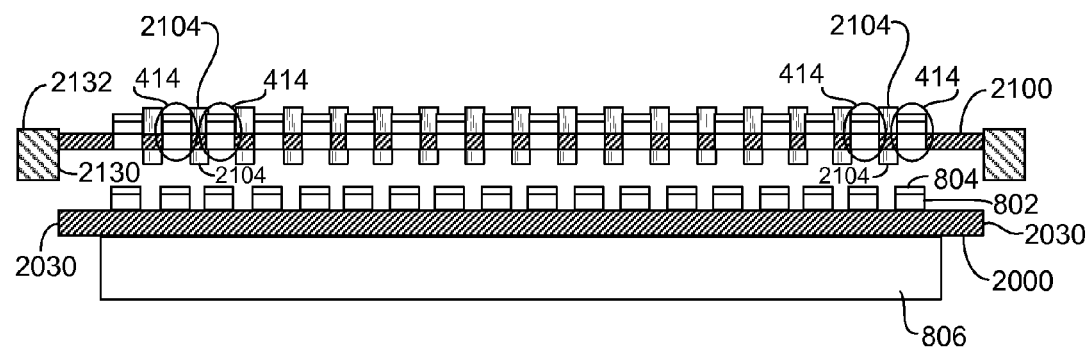
FIG. 22 is a sectional view of the preform contacts provide in the permanent preform array carrier shown in FIG. 21 disposed above and in alignment with the solder paste/metal pads on the plastic land grid array (PLGA) module carrier shown in FIG. 20. These components are subsequently brought into contact with each other and soldered together to form the assembly shown in FIG. 23.
Figure 23:
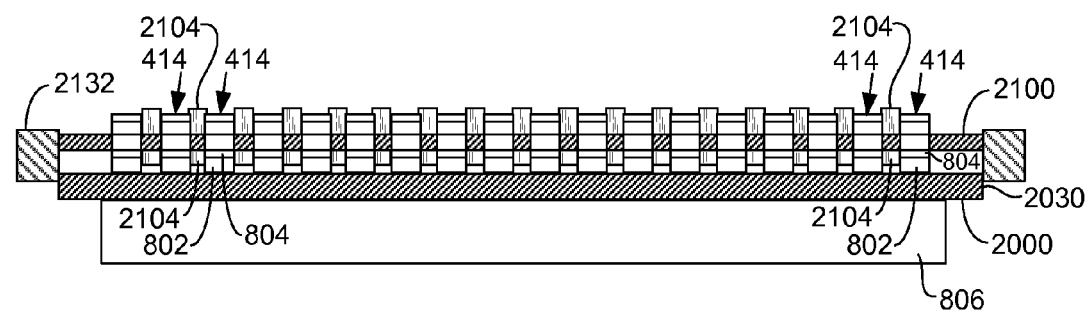
FIG. 23 is a sectional view of an assembly in which the preform contacts provided in the permanent preform array carrier shown in FIG. 21 are attached to the solder paste/metal pads on the plastic land grid array (PLGA) module carrier shown in FIG. 20 by reflowing the solder paste in accordance with the preferred embodiments of the present invention.

Referring now to FIGS. 22-23, there is depicted an exemplary method from fabricating a plastic land grid array (PLGA) module with an enhanced contact metallurgy construction in accordance with the preferred embodiments of the present invention. FIG. 22 is a sectional view of the preform contacts 414 provided in the permanent preform array carrier 2100 shown in FIG. 21 disposed above and in alignment with the solder paste 804/metal pads 802 on the plastic land grid array (PLGA) module carrier 2000 shown in FIG. 20. These components are subsequently brought into contact with each other and soldered together to form the assembly shown in FIG. 23.

FIG. 23 is a sectional view of an assembly in which the preform contacts 414 provided in the permanent preform array carrier 2100 are attached to the solder paste 804/metal pads 802 on the plastic land grid array (PLGA) module carrier 2000 by reflowing the solder paste 804 in accordance with the preferred embodiments of the present invention.

Preferably, the support projections 2104 extend at least from the bottom surface (as viewed in FIGS. 22-23) of the permanent preform array carrier 2100 to help support the permanent preform array carrier 2100. In accordance with the preferred embodiments of the present invention, the lower ends (as viewed in FIG. 23) of the support projections 2104 are preferably spaced a small distance from the upper surface (as viewed in FIG. 23) of the PLGA module carrier 2000 so as not to interfere as the preform contacts 414 are brought into contact with the solder paste 804/metal pads 802 and the solder paste 804 is reflowed.

In addition, the support projections 2104 may extend from the top surface (as viewed in FIGS. 22-23) of the permanent preform array carrier 2100 to function as the stops (corresponding to stops 350 in FIG. 3). Alternatively, the upper ends of the support projections 2104 may instead terminate within or slightly above the permanent preform array carrier 2100 so that the preform contacts 414 are the highest feature on the permanent preform array carrier 2100.

One skilled in the art will appreciate that many variations are possible within the scope of the present invention. For example, although the preferred embodiments of the present invention are described herein within the context of a plastic land grid array (PLGA), the present invention may be utilized in the context of other substrates, such as a printed wiring board (PWB) having a subcomposite laminate construction and/or a double-sided LGA site. Thus, while the present invention has been particularly shown and described with reference to the preferred embodiments thereof, it will be understood by those skilled in the art that these and other changes in form and detail may be made therein without departing from the spirit and scope of the present invention.

What is claimed is:

1. An apparatus, comprising:
    a substrate having a surface with a plurality of metal pads, wherein the substrate is either a plastic land grid array (PLGA) module carrier or a printed wiring board (PWB);
    a plurality of preform contacts each respectively soldered to one of the plurality of metal pads and lying entirely on the surface of the substrate with the plurality of metal pads without any portion of the preform contact extending into the substrate, wherein each of the preform contacts comprises a metal preform base having a lower surface attached to one of the plurality of metal pads through a solder layer, wherein each of the preform contacts comprises an electrolytic noble metal plating over the metal preform base, wherein each of the preform contacts is substantially disc-shaped and has a substantially planar top surface and a substantially planar bottom surface that are substantially parallel to each other, wherein the substantially planar top surface of each of the preform contacts is defined by an upper surface of the electrolytic noble metal plating, and wherein the substantially planar bottom surface of each of the preform contacts is defined by the lower surface of the metal preform base and is in physical contact with the solder layer.

2. The apparatus as recited in claim 1, wherein each of the preform contacts is attached to a preform array carrier.

3. The apparatus as recited in claim 2, wherein each of the preform contacts is at least one of retained in a hole extending through the preform array carrier, molded into the preform array carrier, and/or adhered to the preform array carrier using adhesive.

4. The apparatus as recited in claim 2, wherein the preform array carrier incorporates support projections provided between adjacent ones of the plurality of preform contacts and/or at a peripheral portion of the preform array carrier, and wherein each of the support projections extends from the preform array carrier toward the substrate.

5. The apparatus as recited in claim 2, wherein the preform array carrier incorporates one or more mechanical alignment features, and wherein each of the mechanical alignment features is configured to register with a corresponding feature of the substrate.

6. An apparatus, comprising:
    a substrate having a surface with a plurality of metal pads, wherein the substrate is either a plastic land grid array (PLGA) module carrier or a printed wiring board (PWB);
    a plurality of preform contacts each respectively soldered to one of the plurality of metal pads, wherein each of the preform contacts comprises a metal preform base attached to one of the plurality of metal pads and an electrolytic noble metal plating over the metal preform base, wherein each of the metal pads comprises copper, wherein each of the preform contacts comprises an electrolytic non-noble metal underplating interposed between the metal preform base and the electrolytic noble metal plating, wherein the metal preform base of each of the preform contacts comprises copper, wherein the electrolytic non-noble metal underplating of each of the preform contacts comprises nickel and has a thickness of approximately 80-400 microinches, and wherein the electrolytic noble metal plating of each of the preform contacts comprises gold and has a thickness of approximately 30-60 microinches.

7. The apparatus as recited in claim 6, wherein the electrolytic noble metal plating comprises hard gold that incorporates one or more hardening agents.

8. A method comprising the steps of:

providing a substrate having a surface with a plurality of metal pads, wherein the substrate is either a plastic land grid array (PLGA) module carrier or a printed wiring board (PWB);

providing a plurality of preform contacts, wherein each of the preform contacts comprises a metal preform base having a lower surface and an electrolytic noble metal plating over the metal preform base, wherein each of the preform contacts is substantially disc-shaped and has a substantially planar top surface and a substantially planar bottom surface that are substantially parallel to each other, wherein the substantially planar top surface of each of the preform contacts is defined by an upper surface of the electrolytic noble metal plating, and wherein the substantially planar bottom surface of each of the preform contacts is defined by the lower surface of the metal preform base;

soldering the plurality of preform contacts to the plurality of metal pads so that each of the preform contacts is lying entirely on the surface of the substrate with the plurality of metal pads without any portion of the preform contact extending into the substrate and so that the lower surface of each of the preform contacts is respectively attached to one of the plurality of metal pads through a solder layer, wherein the substantially planar surface of each of the preform contacts is in physical contact with the solder layer.

9. The method as recited in claim 8, wherein each of the metal pads comprises copper, wherein each of the preform contacts comprises an electrolytic non-noble metal underplating interposed between the metal preform base and the electrolytic noble metal plating, wherein the metal preform base of each of the preform contacts comprises copper, wherein the electrolytic non-noble metal underplating of each of the preform contacts comprises nickel and has a thickness of approximately 80-400 microinches, wherein the electrolytic noble metal plating of each of the preform contacts comprises hard gold that incorporates one or more hardening agents and has a thickness of approximately 30-60 microinches.

10. The method as recited in claim 8, wherein the step of providing a substrate includes the step of:

stenciling the metal pads with a solder paste.

11. The method as recited in claim 10, wherein the step of providing a plurality of preform contacts includes the step of:

providing the plurality of preform contacts in or on a preform array carrier.

12. The method as recited in claim 11, wherein the step of soldering the plurality of preform contacts to the plurality of metal pads includes the steps of:

aligning the preform array carrier with respect to the substrate so that the preform contacts provided in or on the preform array carrier are positioned to abut against the solder paste stenciled on metal pads of the substrate;

reflowing the solder paste after the aligning step is completed;

removing the preform array carrier after the reflowing step is completed.

13. The method as recited in claim 8, wherein the step of providing a substrate includes the step of:

applying a fluxed solder preform to the metal pads.

14. The method as recited in claim 13, wherein the step of providing a plurality of preform contacts includes the step of:

providing the plurality of preform contacts in or on a preform array carrier.

15. The method as recited in claim 14, wherein the step of attaching the plurality of preform contacts to the plurality of metal pads includes the steps of:

aligning the preform array carrier with respect to the substrate so that the preform contacts provided in or on the preform array carrier are positioned to abut against the fluxed solder preform applied to the metal pads of the substrate;

reflowing the fluxed solder preform after the aligning step is completed;

removing the preform array carrier after the reflowing step is completed.

16. A method comprising the steps of:

providing a substrate having a surface with a plurality of metal pads, wherein the substrate is either a plastic land grid array (PLGA) module carrier or a printed wiring board (PWB);

providing a plurality of preform contacts attached to a preform array carrier, wherein each of the preform contacts comprises a metal preform base having a lower surface and an electrolytic noble metal plating over the metal preform base, wherein each of the preform contacts is substantially disc-shaped and has a substantially planar top surface and a substantially planar bottom surface that are substantially parallel to each other, wherein the substantially planar top surface of each of the preform contacts is defined by an upper surface of the electrolytic noble metal plating, and wherein the substantially planar bottom surface of each of the preform contacts is defined by the lower surface of the metal preform base;

soldering the plurality of preform contacts to the plurality of metal pads so that each of the preform contacts is lying entirely on the surface of the substrate with the plurality of metal pads without any portion of the preform contact extending into the substrate and so that the lower surface of each of the preform contacts is respectively attached to one of the plurality of metal pads through a solder layer, wherein the substantially planar surface of each of the preform contacts is in physical contact with the solder layer.

17. The method as recited in claim 16, wherein each of the metal pads comprises copper, wherein each of the preform contacts comprises an electrolytic non-noble metal underplating interposed between the metal preform base and the electrolytic noble metal plating, wherein the metal preform base of each of the preform contacts comprises copper, wherein the electrolytic non-noble metal underplating of each of the preform contacts comprises nickel and has a thickness of approximately 80-400 microinches, wherein the electrolytic noble metal plating of each of the preform contacts comprises hard gold that incorporates one or more hardening agents and has a thickness of approximately 30-60 microinches.

18. The method as recited in claim 16, wherein the step of providing a substrate includes at least one of the steps of:
   stenciling the metal pads with a solder paste;
   applying a fluxed solder preform to the metal pads.

19. The method as recited in claim 18, wherein the step of soldering the plurality of preform contacts to the plurality of metal pads includes the steps of:
   aligning one or more mechanical alignment features of the preform array carrier with respect to the substrate so that the preform contacts attached to the preform array carrier are positioned to abut against the solder paste stenciled on the metal pads of the substrate and/or to abut against the fluxed solder preform applied to the metal pads of the substrate;
   reflowing the solder paste and/or the fluxed solder preform after the aligning step is completed.

\* \* \* \* \*